(12) United States Patent
Lee et al.

(10) Patent No.: US 8,437,120 B2
(45) Date of Patent: May 7, 2013

(54) IMAGE DISPLAY DEVICE

(75) Inventors: Dong Jin Lee, Hwaseong-si (KR); Hyun Jun Jung, Yongin-si (KR); Weon Hee Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 12/938,409

(22) Filed: Nov. 3, 2010

(65) Prior Publication Data

US 2011/0116217 A1 May 19, 2011

(30) Foreign Application Priority Data

Nov. 17, 2009 (KR) .................. 10-2009-0110597

(51) Int. Cl.
*G06F 1/16* (2006.01)
(52) U.S. Cl.
USPC .................................................... 361/679.01
(58) Field of Classification Search ............. 361/679.01, 361/679.21
See application file for complete search history.

(56) References Cited

U.S. PATENT DOCUMENTS

| 6,002,582 | A | * | 12/1999 | Yeager et al. | 361/679.21 |
|---|---|---|---|---|---|
| 6,894,739 | B2 | * | 5/2005 | Sung et al. | 349/58 |
| 6,919,937 | B2 | * | 7/2005 | Kim et al. | 349/58 |
| 7,170,759 | B2 | * | 1/2007 | Soga | 361/825 |
| 7,796,381 | B2 | * | 9/2010 | Zuo et al. | 361/679.57 |
| 7,961,457 | B2 | * | 6/2011 | Huang | 361/679.21 |
| 2005/0231658 | A1 | * | 10/2005 | Chieh | 349/56 |
| 2008/0094789 | A1 | * | 4/2008 | Lee | 361/681 |
| 2009/0080148 | A1 | * | 3/2009 | Sugawara | 361/679.02 |
| 2009/0237586 | A1 | * | 9/2009 | Han et al. | 349/58 |
| 2010/0053852 | A1 | * | 3/2010 | Tseng et al. | 361/679.01 |
| 2010/0061044 | A1 | * | 3/2010 | Zou et al. | 361/679.01 |
| 2010/0302717 | A1 | * | 12/2010 | Oh et al. | 361/679.01 |
| 2011/0058320 | A1 | * | 3/2011 | Kim et al. | 361/679.01 |

* cited by examiner

*Primary Examiner* — Lisa Lea Edmonds
(74) *Attorney, Agent, or Firm* — Sughrue Mion, PLLC

(57) ABSTRACT

An image display device includes front and rear covers which surround a display panel and a plurality of connection members connected to the display panel and connected to each of the covers. Thereby, the display panel has a bezel part having a narrow width, and the front and rear covers are easily fixed to each other.

20 Claims, 9 Drawing Sheets

IMAGE DISPLAY DEVICE

CROSS-REFERENCE TO RELATED APPLICATION

This application claims the benefit of Korean Patent Application No. 10-2009-0110597, filed on Nov. 17, 2009 in the Korean Intellectual Property Office, the disclosure of which is incorporated herein by reference.

BACKGROUND

1. Field

Exemplary embodiments relate to an image display device having an improved connection structure of a front cover and a rear cover surrounding a display panel.

2. Description of the Related Art

As replacements for a conventional cathode ray tube (CRT), image display devices having various display panels, such as a liquid crystal display (LCD) panel, a plasma display panel (PDP), and a light emitting diode (LED) panel, have been developed.

These image display devices have been developed in light of slim and light-weight trends in order to obtain competitive power. Particularly, a reduction in a width (hereinafter, referred to as bezel) from the outer line of a display panel to an active area where an image is actually displayed so as to reduce the outer size of an image display device is progressing.

In general, an image display device includes a display panel, such as an LCD, a PDP, or an LED, and a front cover and a rear cover surrounding front and rear parts of the display panel, and connection between the display panel and the front and rear covers is achieved by arranging the display panel between the front cover and the rear cover and then fixing the front and rear covers to the display panel using screws.

Therefore, a designated bezel width is required so as to form connection holes to be connected to the screws through the edge of the display panel. Accordingly, it may be difficult to reduce the outer size of the image display device.

SUMMARY

Therefore, it is an aspect of the exemplary embodiments to provide an image display device having connection members to connect a display panel with a bezel part having a narrow width and front and rear covers.

It is another aspect of the exemplary embodiments to provide an image display device having a connection structure which enables a display panel and front and rear covers to be easily assembled and disassembled.

Additional aspects will be set forth in part in the description which follows and, in part, will be obvious from the description, or may be learned by practice of the exemplary embodiments.

In accordance with one aspect of an exemplary embodiment, an image display device includes a display panel, a front cover and a rear cover surrounding the display panel, and a plurality of connection members inserted into designated parts of an edge of the display panel, each of the connection members including a first connection part connected with the front cover and a second connection part connected with the rear cover, wherein the front cover and the rear cover are respectively fixed to the connection members through the first connection part and the second connection part.

A plurality of latching hooks may be disposed at an edge of a rear surface of the front cover, and the first connection parts may include an elastic latching part which elastically deforms when the elastic latching part enters a lower part of one of the plurality of latching hooks from an upper part of the one latching hook and which is supported by the one latching hook to restrict upward movement of the display panel toward the upper part of the one latching hook.

The second connection part may include a through hole corresponding to one of a plurality of respective holes disposed at the rear cover, and the rear cover may be fixed to the plurality of connection members through fastening members, which are fastened to the through hole of the second connection part and one of the plurality of holes disposed at the rear cover.

When the plurality of connection members slide along the edge of the display panel, the elastic latching part of the one connection member may be released from the one latching hook.

A position fixing part may be disposed at one of the plurality of connection members so as to restrict sliding movement of the one connection member, when the one connection member is inserted into the display panel.

The position fixing part may include a fixing hole into which one of a plurality of fixing protrusions disposed on the display panel is inserted.

A guide part may be disposed at the one connection member to guide rectilinear movement of the one connection member when the one connection member slides along the edge of the display panel.

The guide part may include a guide hole connected to a guide protrusion disposed on the display panel.

In accordance with an aspect of another exemplary embodiment, an image display device includes a display panel, a front cover surrounding a front part of the display panel, and including a plurality of latching hooks formed at an edge of a rear surface thereof, a rear cover surrounding a rear part of the display panel, and including a plurality of screw holes, and a plurality of connection members, one of the connection members comprising a main body comprising an insertion groove surrounding a part of an edge of the display panel so as to connect the display panel to the front cover and the rear cover, an elastic latching part disposed at one side of the main body and connected to one of the plurality of latching hooks of the front cover, and a through hole disposed at the other side of the main body and connected to one of the plurality of holes of the rear cover.

The plurality of connection members may be fixed to the display panel by inserting the part of the edge of the display panel into the insertion groove.

The insertion groove may include a front support part to support a front surface of the display panel, a side support part extending at an angle from one end of the front support part to surround a side surface of the display panel, and a rear support part extending at an angle from one end of the side support part to support a rear surface of the display panel.

The front support part may have a smaller size than that of the rear support part, and include a flange part protruded upwardly from the other end of the front support part, the flange part being received in a flange seat groove disposed on the display panel.

The elastic latching part may be elastically deformed when the elastic latching part enters a lower part of the one latching hook from an upper part of the one latching hook and may be supported by the one latching hook so as to fix the display panel to the front cover.

The elastic latching part may be provided with a distal protruding end cut out and protruding from one side of the side support part.

The rear cover may be connected to the one connection member by a fastening member connected to one of the plurality of holes of the rear cover and the through hole of the one connection member.

A fixing protrusion may be provided on the rear part of the display panel and a fixing hole may be formed on the one connection member, and the fixing hole may be connected to the fixing protrusion when the one connection member is mounted on the display panel.

A guide protrusion may be provided on the rear part of the display panel and a guide hole may be formed the one connection member, and the guide protrusion may be connected to the guide hole.

The guide projection may slide along the guide hole in a direction parallel to the edge of the display panel.

When the one connection member slides along the guide protrusion, the elastic latching part of the one connection member may be released from the one latching hook.

According to an aspect of another exemplary embodiment, an image display device includes a display panel; a pair of covers substantially enclosing the display panel; a plurality of connection members, one of which comprises a substantially U-shaped main body disposed over and slidable along an edge of the display panel; and a latching hook provided on an inner surface of one of the covers and attachable to the one connection member when the one connection member slides along the edge of the display panel.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION

Figure 1:
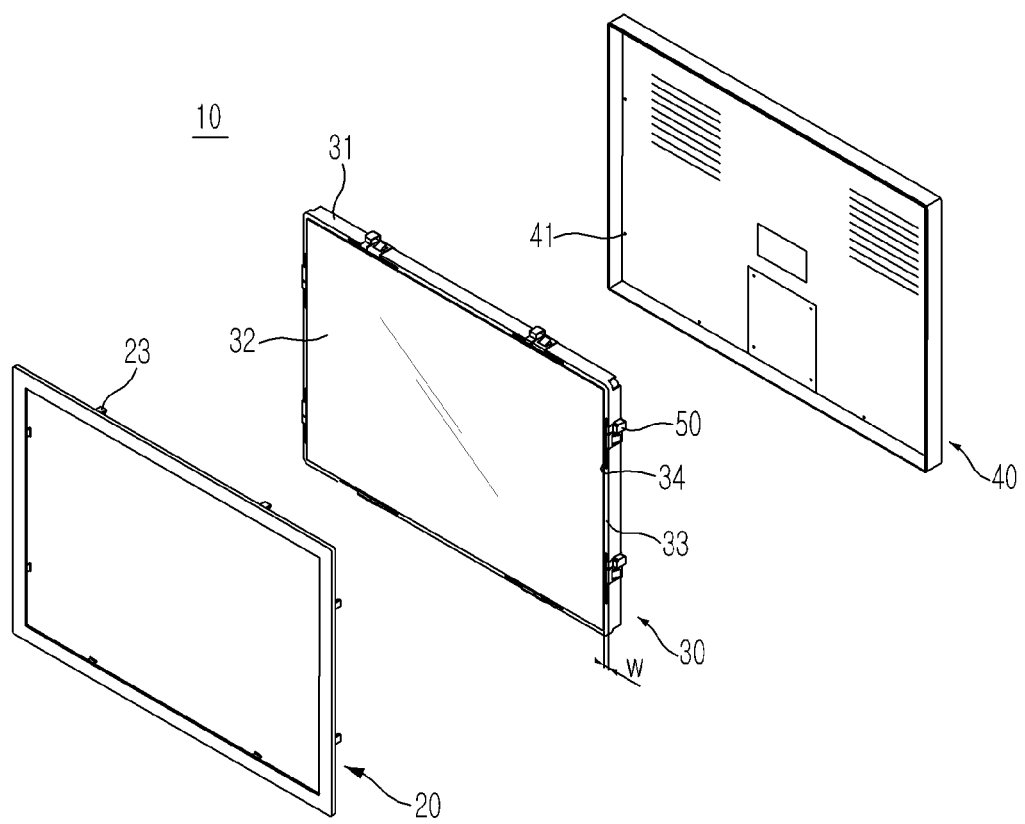
FIG. 1 is an exploded perspective view illustrating a connection structure of a display panel and covers of an image display device in accordance with an exemplary embodiment.

Reference will now be made in detail to the exemplary embodiments, examples of which are illustrated in the accompanying drawings, wherein like reference numerals refer to like elements throughout.

Figure 2:
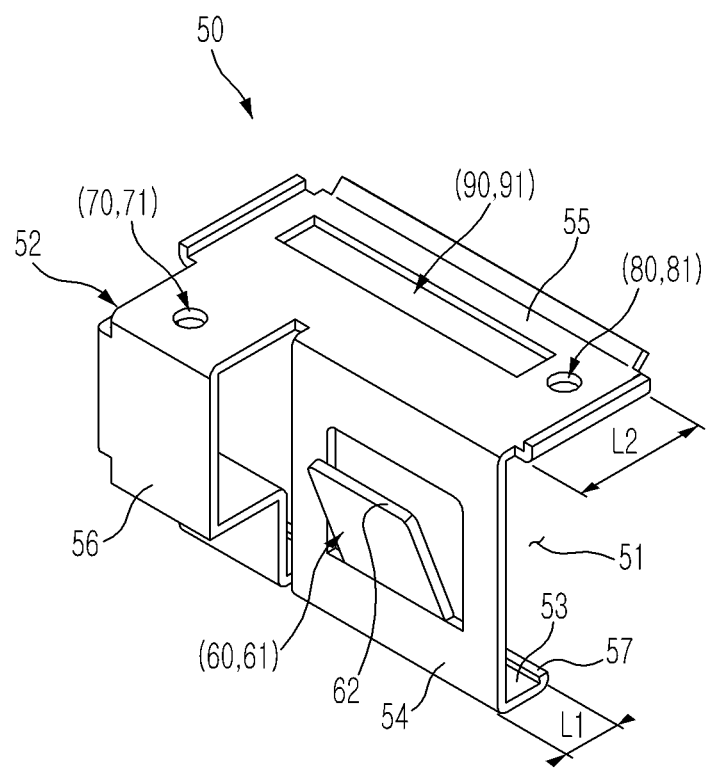
FIG. 2 is a perspective view illustrating a connection member connected to the display panel of the image display device in accordance with the exemplary embodiment.
Figure 3:
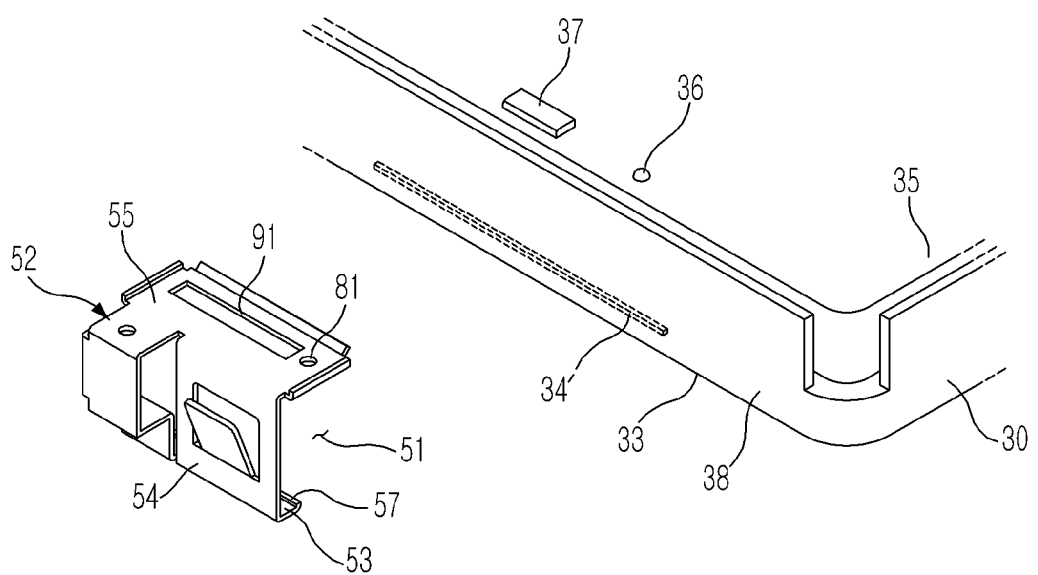
FIG. 3 is a perspective view illustrating a separation state of the connection member from the display panel of the image display device in accordance with the exemplary embodiment.
Figure 4:
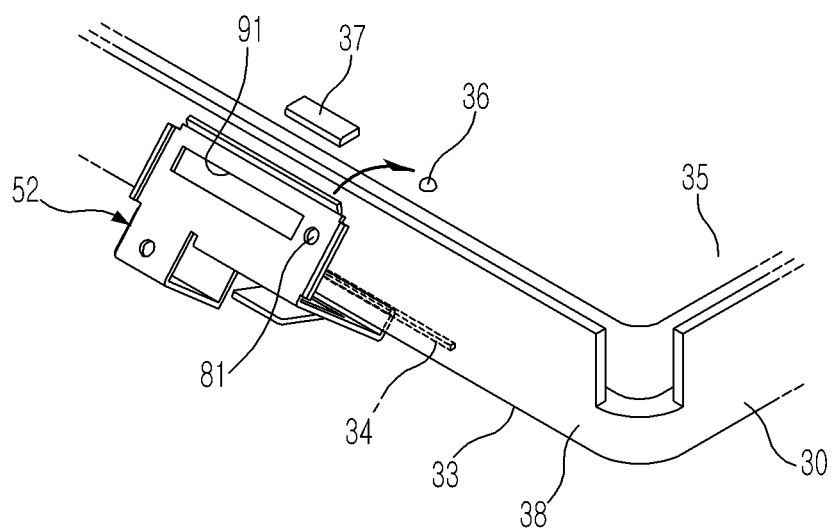
FIG. 4 is a perspective view illustrating a connecting operation of the connection member to the display panel of the image display device in accordance with the exemplary embodiment.

FIG. 1 is an exploded perspective view illustrating a connection structure of a display panel and covers of an image display device in accordance with one exemplary embodiment, FIG. 2 is a perspective view illustrating a connection member connected to the display panel of the image display device in accordance with the exemplary embodiment, FIG. 3 is a perspective view illustrating a separation state of the connection member from the display panel of the image display device in accordance with the exemplary embodiment, and FIG. 4 is a perspective view illustrating a connecting operation of the connection member to the display panel of the image display device in accordance with the exemplary embodiment.

As shown in FIG. 1, an image display device 10 in accordance with the exemplary embodiment includes a display panel 30 to display an image, a front cover 20 arranged in front of the display panel 30, and a rear cover 40 surrounding the rear part of the display panel 30.

The display panel 30 serving to display an image may include an LCD displaying an image using liquid crystals or a PDP displaying an image using plasma generated by electric discharge.

The display panel 30 includes a case 31 formed approximately in the shape of an box, and houses a PDP module or an LCD module to which light is irradiated by a backlight unit including, for example, cathode fluorescent lamps or LEDs. In the case of a backlight unit using the LEDs as a light source, the backlight unit may be provided as a direct type or an edge type.

A display part 32 to display data corresponding to a signal, and a bezel part 33 located at the outside of the display part 32 are provided on the front surface of the display panel 30.

The bezel part 33 has a width W from the outer peripheral edge of the display panel 30 to the display part 32 where an image is actually displayed. In this exemplary embodiment, the bezel part 33 of the display panel 30 does not require separate fastening structures, such as screw fastening holes, to be connected with counterparts, and thus the width of the bezel part 33 may be narrowed.

Such a display panel 30 may be fixed to the front cover 20 and the rear cover 40 under the condition that the display panel 30 is arranged in a reception space formed between the front cover 20 and the rear cover 40.

For this purpose, clamp-type connection members 50 to fix the display panel 30 to the front cover 20 and the rear cover 40 are detachably provided at the edge of the display panel 30.

With reference to FIGS. 2 and 3, each of the connection members 50 includes a main body 52 provided with a front support part 53 to support a part of the bezel part 33 arranged on the front surface of the display panel 30 so as to form an insertion groove 51 into which a part of the edge of the display panel 30 is inserted, a side support part 54 extending at a substantially perpendicular angle from one end of the front support part 53 to surround a part of a side surface 38 of the display panel 30, and a rear support part 55 extending at a substantially perpendicular angle from one end of the side support part 54 to support a part of a rear surface 35 of the display panel 30.

The insertion groove 51 provided on the main body 52 may be formed in a shape corresponding to the edge of the display panel 30 by cutting or bending a metal plate.

Further, the insertion groove 51 may be provided with a designated elasticity so as to enable the connection member 50 to be fixed to the edge of the display panel 30 through pressing.

By inserting a part of the edge of the display panel 30 into the insertion groove 51, the connection member 50 may be connected to the part of the edge of the display panel 30.

A length $L_1$ of the front support part 53 extended from the side support part 54 may be smaller than a length $L_2$ of the rear support part 55 extended from the side support part 54 so as to facilitate insertion of the connection member 50 into the display panel 30.

A flange part 57 extended upwardly from the other end of the front support part 53 is provided on the front support part 53, and a flange seat groove 34, into which the flange part 57 is inserted and seated, is provided in the lengthwise direction on the bezel part 33 formed on the front surface of the display panel 30

Therethrough, when the connection member 50 is rotated under the condition that the flange part 57 of the connection member 50 is inserted and seated into the flange seat groove 34 of the display panel 30, as shown in FIG. 4, the main body 52 is rotated around the flange seat groove 34 and the edge of the display panel 30 is inserted into the insertion groove 51, simultaneously.

Further, a position fixing part 80 may be provided on the connection member 50, as shown in FIG. 2. The position fixing part 80 determines a position of the connection member 50 inserted into the display panel 30 if the connection member 50 is inserted into a part of the edge of the display panel 30 and restricts sliding movement of the connection member 50 if the connection member 50 has been connected to the display panel 30, simultaneously.

Although the position fixing part 80 is formed in any shape which may be connected with a latching structure provided on the display panel 30 so as to restrict movement of the connection member 50 along the edge of the display panel 30, the position fixing part 80 may include a through hole 81 formed through a designated part of the rear support part 55, as shown in FIG. 2.

If the position fixing part 80 includes the through hole 81, a fixing protrusion 36 connected to the through hole 81 may be provided at a part of the rear surface 35 of the display panel 30, as shown in FIG. 3.

Therefore, when the connection member 50 is connected to the display panel 30, the fixing protrusion 36 is inserted into the through hole 81 formed through the connection member 50, thereby restricting movement of the connection member 50.

Although this exemplary embodiment illustrates that the position fixing part 80 includes the through hole 81, the position fixing part 80 may be formed in the shape of a fixing protrusion or a latching rib. In this case, a latching structure corresponding to the fixing protrusion or the latching rib may be provided on the display panel 30.

As shown in FIG. 2, the connection member 50 further includes a first connection part 60 to be connected with the front cover 20, and a second connection part 70 to be connected with the rear cover 40.

That is, the front and rear covers 20 and 40 surrounding the front and rear parts of the display panel 30 are connected to each other through the connection members 50 mounted on the display panel 30, thereby fixing the display panel 30 arranged between the front cover 20 and the rear cover 40.

For this purpose, a plurality of latching hooks 23 (with reference to FIG. 1) are provided on the edge of a rear surface 21 of the front cover 20, and the first connection part 60 to be connected with the front cover 20 includes an elastic latching part 61 connected with each of the latching hooks 23.

The elastic latching part 61 is formed integrally with the side support part 54 so as to be provided with a free terminal 62, which is cut off from one side of the side support part 54 of the main body 52 and is protruded.

Thereby, the front cover 20 and the display panel 30 are easily connected simply by seating the display panel 30 on the rear surface 21 of the front cover 20.

Figure 5:
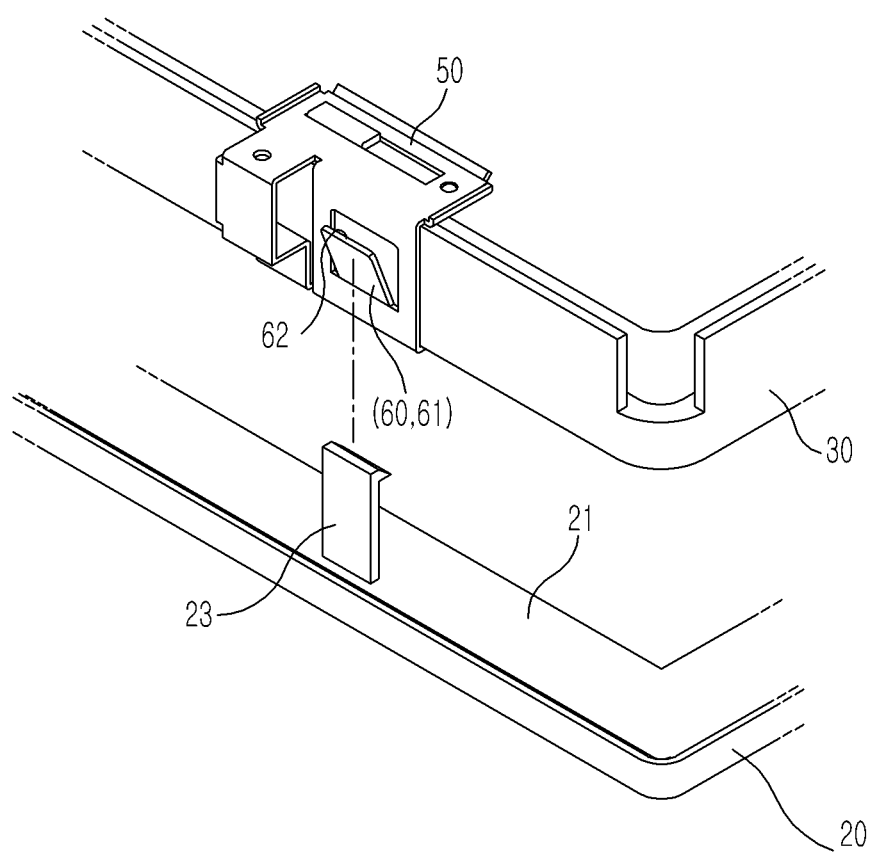
FIGS. 5 and 6 are views illustrating connection relations between a front cover and the connection member of the image display device in accordance with the exemplary embodiment.
Figure 6:
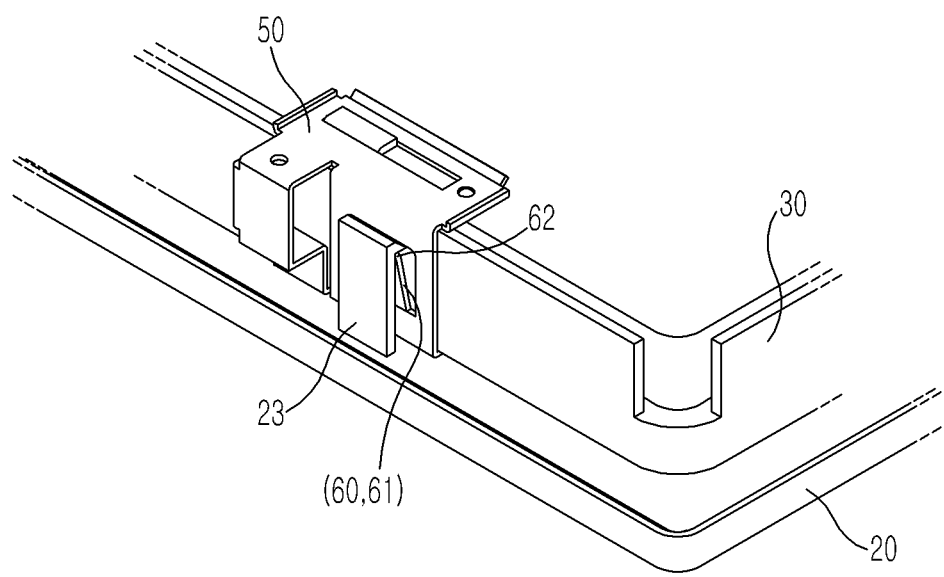

That is, if the display panel 30 is seated on the rear surface 21 of the front cover 20, as shown in FIG. 5, the elastic latching part 61 of the connection member 50 enters the lower part of the latching hook 23 from the upper part of the latching hook 23. Thus, as the elastic latching part 61 is elastically deformed by the latching hook 23, the free terminal 62 of the elastic latching part 61 is supported by the latching hook 23, as shown in FIG. 6.

Therefore, upward movement of the display panel 30 connected to the front cover 20 to the upper part of the latching hook 23 is restricted by the elastic latching part 61 supported by the latching hook 23, and horizontal movement of the display panel 30 is restricted by the plural latching hooks 23. Accordingly, the display panel 30 is firmly connected to the front cover 20.

Further, since the display panel 30 is fixed to the front cover 20 through the connection members 50, the bezel part 33 of the display panel 30 does not require any connection part to be connected with the front cover 20, and thus the width of the bezel part 33 may be narrowed.

Although this exemplary embodiment illustrates that the first connection part 60 includes the elastic latching part 61 connected with the latching hook 23 provided on the rear surface 21 of the front cover 20, the first connection part 60 may include different structures hooked to the front cover 20 or structures to enable connection of the front cover 20 and the connection member 50, such as a screw connection.

However, if the front cover 20 is very glossy, the first connection part 60 may include a hook connection structure to prevent surface deformation of the front cover 20 due to screw fastening force.

Figure 7:
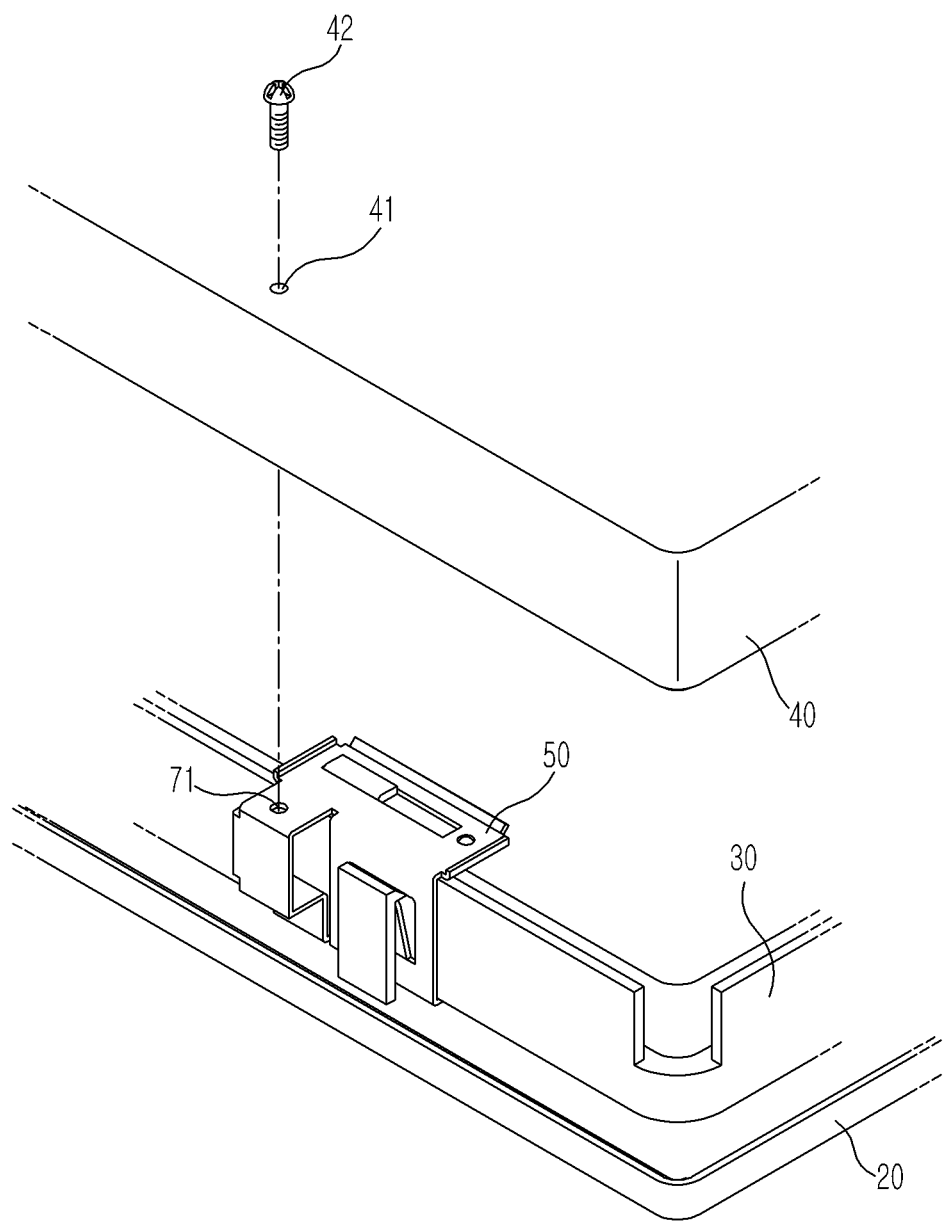
FIG. 7 is a view illustrating connection relations between a rear cover and the connection member of the image display device in accordance with the exemplary embodiment.

With reference to FIGS. 2 and 7, the second connection part 70 provided on the connection member 50 to be connected with the rear cover 40 includes a through hole 71 to which a screw is fastened.

The through hole 71 is formed through the upper surface of a protrusion part 56 protruded outwardly from one side of the side support part 54 of the main body 52.

A plurality of screw holes 41 is provided on the rear cover 40 surrounding the rear part of the display panel 30 at positions corresponding to the through holes 71 of the connection members 50.

Therefore, the rear cover 40 is firmly fixed to the connection members 50 by inserting fastening members 42, such as screws, into the screw holes 41 of the rear cover 40 and the through holes 71 of the connection members 50.

Although this embodiment illustrates that the second connection part 70 connected with the rear cover 40 includes the through hole 71, the second connection part 70 may include a hook structure similar to that of the first connection part 60.

However, in order to facilitate disassembly of the image display device 10 for serviceability, the second connection part 70 may include a screw connection structure.

Further, in order to facilitate separation of the display panel 30 from the front cover 20, the connection members 50 may be provided such that they slide along the edge of the display panel 30.

With reference to FIG. 2, a guide part 90 to guide stable rectilinear movement of the connection member 50 when the connection member 50 slides along the edge of the display panel 30 may be provided on the main body 52 of the connection member 50

Figure 8:
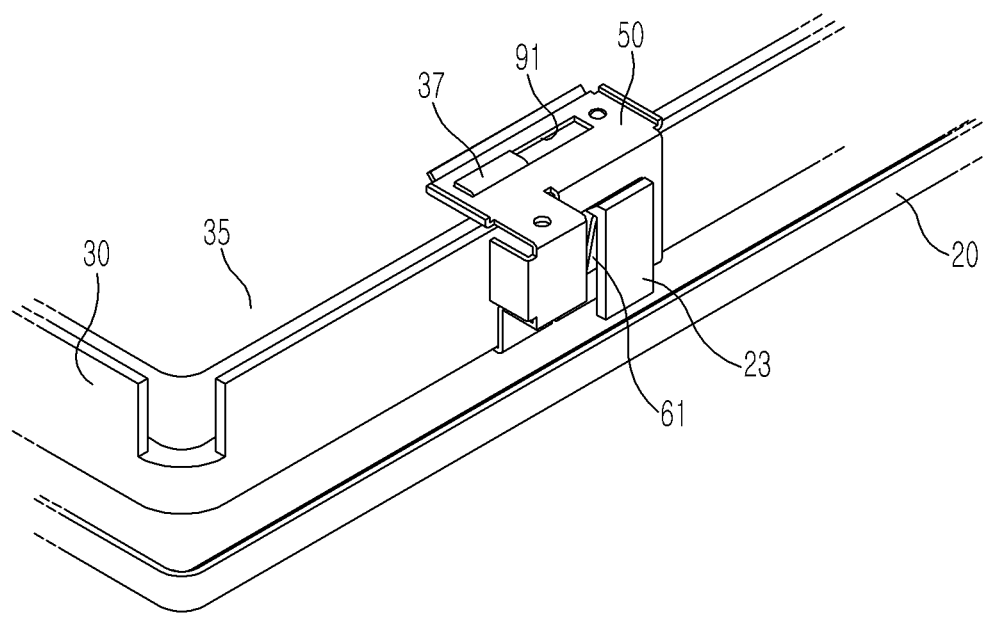
FIGS. 8 and 9 are views illustrating a releasing operation of an elastic latching part of the connection member from a latching hook of the front cover in accordance with the exemplary embodiment.

The guide part 90 includes a long guide hole 91, which is extended in the lengthwise direction, formed at one side of the rear support part 55. If the connection member 50 is connected to the display panel 30, a guide protrusion 37 formed at a part of the rear surface 35 of the display panel 30 is inserted into the guide hole 91, as shown in FIG. 8.

Although this exemplary embodiment illustrates that the guide part 90 provided on the connection member 50 includes the guide hole 91, the guide part 90 may include a guide protrusion and guide holes, to which the guide protrusions of the guide parts 90 of the connection members 50 are inserted.

Figure 9:
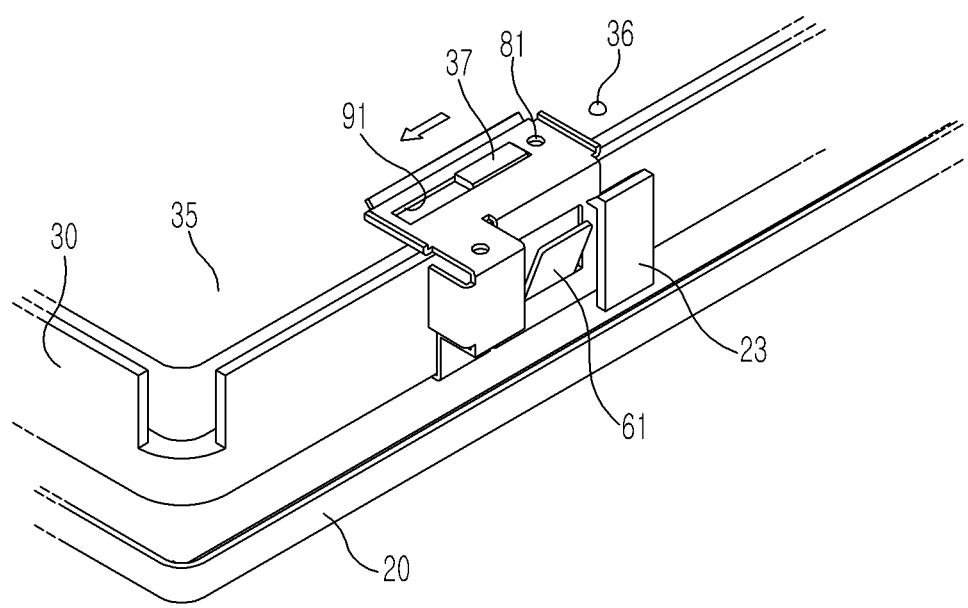

Therefore, when a designated force is applied to the connection member 50, as shown in FIG. 9, the connection member 50 is separated from the fixing protrusion 36 and slides along the guide protrusion 37 at the edge of the display panel 30, and thereby the elastic latching part 61 is released from the latching hook 23 provided on the front cover 20.

Thereafter, when the display panel 30 is lifted from the front cover 20, the display panel 30 is easily separated from the front cover 20.

As is apparent from the above description, in an image display device in accordance with one exemplary embodiment, a display panel, a front cover, and a rear cover are connected through connection members, thereby reducing the width of a bezel part of the display panel and thus reducing the overall size of the image display device.

Further, in the image display device in accordance with this exemplary embodiment, the front cover and the display panel are connected by hook structures of the connection members, thereby preventing surface deformation of the front cover due to screw connection.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. An image display device comprising:
    a display panel;
    a front cover and a rear cover surrounding the display panel; and
    a plurality of connection members inserted into designated parts of an edge of the display panel, each of the plurality of connection members comprising a first connection part connected with the front cover and a second connection part connected with the rear cover,
    wherein the front cover and the rear cover are respectively fixed to the plurality of connection members through the first connection part and the second connection part.

2. The image display device according to claim 1, wherein a plurality of latching hooks are disposed at an edge of a rear surface of the front cover, and the first connection part comprises an elastic latching part which elastically deforms when the elastic latching part enters a lower part of one of the plurality of latching hooks from an upper part of the one latching hook and which is supported by the one latching hook to restrict upward movement of the display panel toward the upper part of the one latching hook.

3. The image display device according to claim 1, wherein the second connection part comprises a through hole corresponding to one of a plurality of holes disposed at the rear cover, and the rear cover is fixed to the plurality of connection members through fastening members, which are fastened to the through hole of the second connection part and one of the plurality of holes disposed at the rear cover.

4. The image display device according to claim 2, wherein, when the plurality of connection members slide along the edge of the display panel, the elastic latching part of the plurality of connection members is released from the one latching hook.

5. The image display device according to claim 1, wherein a position fixing part is disposed at one of the plurality of connection members so as to restrict sliding movement of the one connection member, when the one connection member is inserted into the display panel.

6. The image display device according to claim 5, wherein the position fixing part comprises a fixing hole into which one of a plurality of fixing protrusions disposed on the display panel is inserted.

7. The image display device according to claim 4, wherein a guide part is disposed on one of the plurality of connection members to guide stable rectilinear movement of the one connection member when the one connection member slides along the edge of the display panel.

8. The image display device according to claim 7, wherein the guide part comprises a guide hole connected to a guide protrusion provided on the display panel.

9. An image display device comprising:
    a display panel;
    a front cover surrounding a front part of the display panel, and comprising a plurality of latching hooks formed at an edge of a rear surface of the front cover;
    a rear cover surrounding a rear part of the display panel, and comprising a plurality of holes; and
    a plurality of connection members comprising a plurality of main bodies, one of the plurality of main bodies comprising an insertion groove surrounding a part of an edge of the display panel so as to connect the display panel to the front cover and the rear cover, an elastic latching part disposed at one side of the main body and connected to one of the plurality of latching hooks of the front cover, and a through hole disposed at another side of the main body and connected to one of the plurality of holes of the rear cover.

10. The image display device according to claim 9, wherein of the plurality of connection members are fixed to the display panel by inserting the part of the edge of the display panel into the insertion groove.

11. The image display device according to claim 10, wherein the insertion groove comprises a front support part to support a front surface of the display panel, a side support part extending at an angle from one end of the front support part to surround a side surface of the display panel, and a rear support part extending at an angle from one end of the side support part to support a rear surface of the display panel.

12. The image display device according to claim 11, wherein the front support part is smaller than the rear support part, and comprises a flange part protruded upwardly from another end of the front support part, the flange part being received in a flange seat groove disposed on the display panel.

13. The image display device according to claim 11, wherein the elastic latching part is elastically deformed when the elastic latching part enters a lower part of the one latching hook from an upper part of the one latching hook and is supported by the one latching hook so as to fix the display panel to the front cover.

14. The image display device according to claim 13, wherein the elastic latching part is provided with a distal protruding end cut out and protruded from one side of the side support part.

15. The image display device according to claim 9, wherein the rear cover is connected to the one connection member by a fastening member connected to one of the plurality of holes of the rear cover and the through hole of the one connection member.

16. The image display device according to claim 9, wherein a fixing protrusion is disposed on the rear part of the display panel and a fixing hole is disposed on the one connection member, and the fixing hole is connected to the fixing protrusion when the one connection member is mounted on the display panel.

17. The image display device according to claim 9, wherein a guide protrusion is are disposed on the rear part of the display panel and a guide hole is formed on the one connection member, and the guide protrusion is connected to the guide hole.

18. The image display device according to claim 17, wherein the guide protrusion slides along the guide hole in a direction parallel to the edge of the display panel.

19. The image display device according to claim 18, wherein, when the one connection member slides along the guide protrusion, the elastic latching part of the one connection member is released from the one latching hook.

20. An image display device comprising:
a display panel;
a pair of covers substantially enclosing the display panel;
a plurality of connection members, one of which comprises a substantially U-shaped main body disposed over and slidable along an edge of the display panel; and
a latching hook disposed on an inner surface of one of the covers and attachable to the one connection member when the connection member slides along the edge of the display panel.

* * * * *